(12) United States Patent
Yano

(10) Patent No.: US 10,978,150 B2
(45) Date of Patent: Apr. 13, 2021

(54) MEMORY CIRCUIT AND SEMICONDUCTOR DEVICE

(71) Applicant: Winbond Electronics Corp., Taichung (TW)

(72) Inventor: Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/548,808

(22) Filed: Aug. 22, 2019

(65) Prior Publication Data

US 2020/0143882 A1 May 7, 2020

(30) Foreign Application Priority Data

Nov. 1, 2018 (JP) .............................. JP2018-206352

(51) Int. Cl.
*G11C 11/00* (2006.01)
*G11C 14/00* (2006.01)
*G11C 11/16* (2006.01)

(52) U.S. Cl.
CPC ...... *G11C 14/0081* (2013.01); *G11C 11/1659* (2013.01); *G11C 11/1673* (2013.01); (Continued)

(58) Field of Classification Search
CPC ... G11C 11/4096; G11C 7/04; G11C 11/4093; G11C 11/407; G11C 7/00; G11C 13/0069; G11C 11/1653; G11C 11/1675; G11C 13/004; G11C 11/1673; G11C 11/1693; G11C 13/0038; G11C 11/165; G11C 13/0023; G11C 16/12; G11C 16/14; G11C 16/24; G11C 16/32

See application file for complete search history.

(56) References Cited

U.S. PATENT DOCUMENTS 9,601,198 B2    3/2017  Shuto et al.
2015/0070974 A1*  3/2015  Shuto ................. G11C 11/1675
                                                                365/154

(Continued)

FOREIGN PATENT DOCUMENTS

TW    201618101    5/2016
TW    I579841      4/2017
TW    201725682    7/2017

OTHER PUBLICATIONS

"Office Action of Korea Counterpart Application" with English translation thereof, dated Jun. 22, 2020, p. 1-p. 8.

(Continued)

*Primary Examiner* — Hien N Nguyen
(74) *Attorney, Agent, or Firm* — JCIPRNET

(57) ABSTRACT

A memory circuit and a semiconductor device are provided. The memory circuit has a function of recovering data when power is suddenly shutdown. The memory device includes a bi-stable circuit capable of holding complementary data respectively at nodes N1 and N2; a first non-volatile memory circuit, connected to the node; and a second non-volatile memory circuit connected to the node. The first non-volatile memory circuit stores boot data, and the second non-volatile memory circuit inverts a logic level of the data held at the second node when the second non-volatile memory circuit stores data at the second node.

9 Claims, 4 Drawing Sheets

(52) U.S. Cl.
CPC ...... *G11C 11/1675* (2013.01); *G11C 11/1677* (2013.01); *G11C 11/1697* (2013.01)

(56) References Cited

U.S. PATENT DOCUMENTS

| | | | |
|---|---|---|---|
| 2018/0025765 A1* | 1/2018 | Yokoyama | H01L 49/00 365/158 |
| 2018/0308546 A1 | 10/2018 | Tomita | |

OTHER PUBLICATIONS

"Office Action of Taiwan Counterpart Application," dated Oct. 25, 2019, p. 1-p. 7.
Office Action of Taiwan Counterpart Application, dated Jan. 20, 2020, p. 1-p. 9.
"Office Action of Taiwan Counterpart Application", dated Mar. 30, 2020, p. 1-p. 10.

* cited by examiner

| Forming | | | | | Setting | | | | | Reset | | | | |
|---|---|---|---|---|---|---|---|---|---|---|---|---|---|---|
| VDD | WL | Gate | SL | BL | VDD | WL | Gate | SL | BL | VDD | WL | Gate | SL | BL |
| 2.9 | Vcc | 1.4 | 0 | Vcc | 2.2 | Vcc | 1.7 | 0 | Vcc | 2.7 | Vcc | 2.9 | 2.7 | 0 | ial
MEMORY CIRCUIT AND SEMICONDUCTOR DEVICE

CROSS REFERENCE TO RELATED APPLICATIONS

This application claims the priority benefit of Japanese Patent Application No. 2018-206352, filed on Nov. 1, 2018. The entirety of the above-mentioned patent application is hereby incorporated by reference herein and made a part of this specification.

BACKGROUND

Technical Field

The invention relates to a memory circuit including a bi-stable circuit such as a Static Random Access Memory (SRAM).

Description of Related Art

Bi-stable circuit such as a SRAM, etc., is volatile, and when a power of the bi-stable circuit is blocked, data stored in the bi-stable circuit disappears. In order to block the power of the bi-stable circuit, before the power of the bi-stable circuit is blocked, the data in the bi-stable circuit is stored to a non-volatile Magnetic Tunnel Junction (MTJ), and when the power of the bi-stable circuit is switched on, the data read from the MTJ is restored to the bi-stable circuit. The content disclosed in U.S. Pat. No. 9,601,198 of a patent literature 1 can be referred.

SUMMARY

In a system-on-a-chip, in order to make a sensor or a system to operate immediately, it is required to perform booting, trimming, caching, etc., to the system. Moreover, held data is updated during the operation process. When power is suddenly blocked, it is required to restore to original data updated by a program design.

The disclosure is directed to a memory circuit with a function of restoring original data, and is directed to a memory circuit capable of shortening a start-up time for switching on a power supply.

In an embodiment, the non-volatile memory circuit includes a variable resistance element, and when data held by a node has a first logic level, the variable resistance element is set, and when the data held by the node has a second logic level, the variable resistance element is reset. In an embodiment, the non-volatile memory circuit includes an access transistor and the variable resistance element connected in series between the node and a source line, and when setting writing of the variable resistance element is performed, the access transistor is in a conducting state, and a bias is applied to the variable resistance element in a manner from the node towards the source line; and when reset writing of the variable resistance element is performed, the access transistor is in the conducting state, and the bias is applied to the variable resistance element in a manner from the source line towards the node. In an embodiment, when the data stored in the non-volatile memory circuit is set to the node, reset writing is performed to the variable resistance element of the setting writing, and setting writing is performed the variable resistance element of the reset writing. In an embodiment, the node is connected to a bit line through the transistor, the data stored in the variable resistance element is read out through the bit line for verification. In an embodiment, the memory circuit further includes another non-volatile memory circuit connected to another node, and the another non-volatile memory circuit stores boot data needed when the power is switched on. In an embodiment, when the power is switched on, the boot data stored in the another non-volatile memory circuit is read out to a first node. In an embodiment, the another non-volatile memory circuit includes another an access transistor and a variable resistance element connected in series between the another node and the source line.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figures 1, 2:
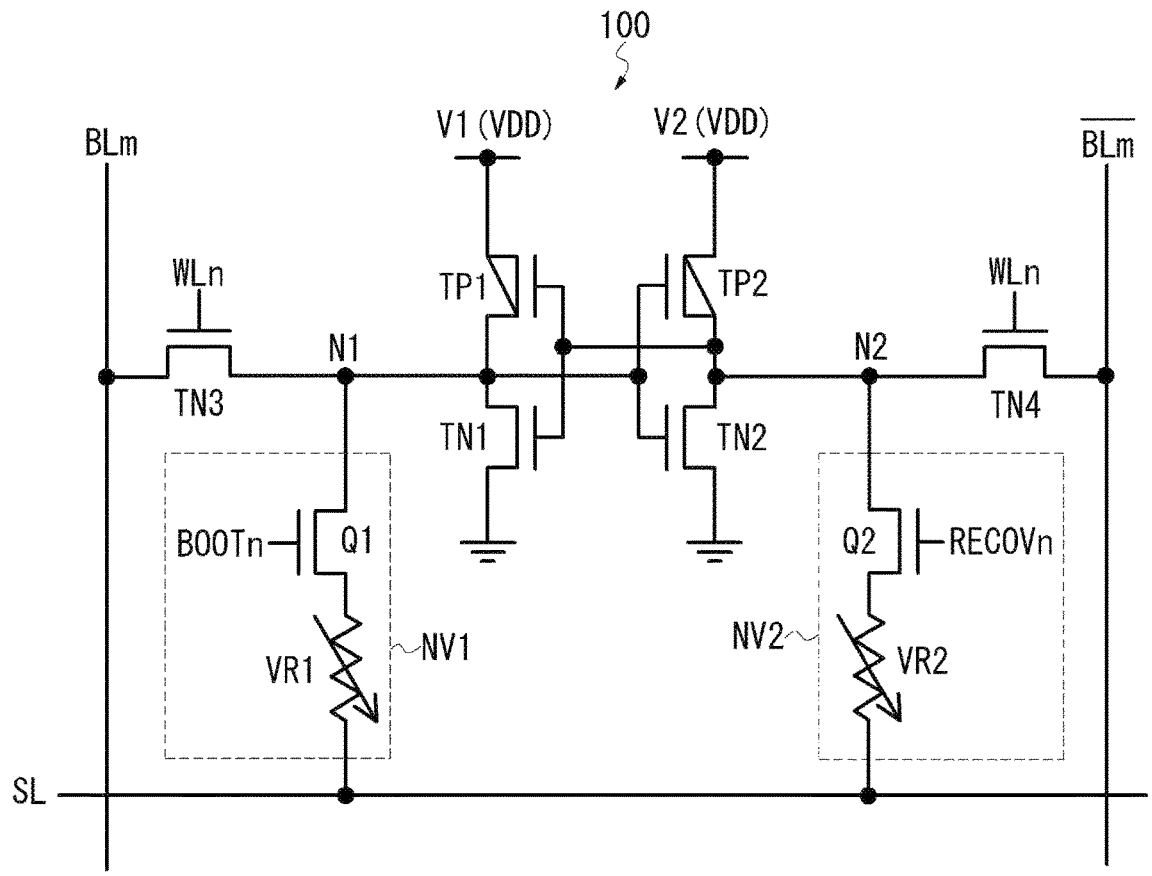
FIG. 1 is a diagram illustrating a construction of a memory circuit according to an embodiment of the invention.
FIG. 2 is an example of bias voltages applied to each part during forming, setting and resetting of the memory circuit according to an embodiment of the invention.

FIG. 1 is a diagram illustrating a configuration of a memory circuit according to an embodiment of the disclosure. As shown in FIG. 1, the memory circuit 100 of the embodiment includes a bi-stable circuit that cross couples a pair of inverters, a pair of non-volatile memory circuits NV1, NV2 connected to the bi-stable circuit. In the embodiment, the memory circuit 100 storing complementary data of 1 bit is shown, and the memory circuit 100 is, for example, a SRAM or a latch circuit including a plurality of bi-stable circuits arranged in an array, and the SRAM may be configured in a controller used for controlling a NAND flash memory.

The memory circuit 100 shown in FIG. 1, for example, a memory cell of the SRAM including 6 Metal Oxide Semiconductor (MOS) transistors, and includes a first complementary metal-oxide-semiconductor (CMOS) inverter including a P-channel MOS transistor TP1 and a N-channel MOS transistor TN1, a second CMOS inverter including a PMOS transistor TP2 and an NMOS transistor TN2, an access NMOS transistor TN3 connected to a node N1, an access NMOS transistor TN4 connected to a node N2. An output of the first CMOS inverter is connected to an input of the second CMOS inverter, and an output of the second CMOS inverter is connected to an input of the first CMOS inverter. The node N1 is connected to the output of the first CMOS inverter, the node N2 is connected to the output of the second CMOS inverter, and the node N1 and the node N2 hold complementary data.

One of terminals of the PMOS transistor TP1 is connected to a first voltage supply portion V1, and one of terminals of the NMOS transistor TN1 is connected to the ground (GND). Similarly, one of terminals of the PMOS transistor TP2 is connected to a second voltage supply portion V2, and one of terminals of the NMOS transistor TN2 is connected to the ground (GND). A voltage about 2.5V or greater than 2.5V is supplied to the memory circuit 100 to serve as a power voltage Vcc, and the first voltage supply portion V1 and the second voltage supply portion V2 may supply a voltage VDD obtained by level shifting the power voltage Vcc to the bi-stable circuit. The bi-stable circuit is a so-called volatile holding circuit for holding data at the node N1 and the node N2 during a period when the first voltage supply portion V1 and the second voltage supply portion V2 supply power, and erase the data held by the node N1 and the node N2 when the power supply from the first voltage supply portion V1 and the second voltage supply portion V2 is blocked.

Reading and writing of the data held by the bi-stable circuit is performed through the access transistor TN3 and the access transistor TN4. One of the terminals of the access transistor TN3 is connected to a bit line BLm, another terminal thereof is connected to the node N1, and a gate thereof is connected to a word line WLn. Moreover, one of the terminals of the access transistor TN4 is connected to a bit line /BLm, another terminal thereof is connected to the node N2, and a gate thereof is connected to the word line WLn.

In a reading operation, by applying a positive voltage to the word line WLn, the access transistor TN3 and the access transistor TN4 are in the turn-on state, and the data held by the node N1 and the node N2 are read to the bit line BLm and the bit line /BLm.

In a writing operation, by applying a positive voltage to the word line WLn, the access transistor TN3 and the access transistor TN4 are turned on, and the data to be written is applied to the bit line BLm and the bit line /BLm. For example, when data of H level held by the node N1 is re-written, data of L level is applied to the bit line BLm.

The memory circuit 100 of the embodiment further includes a pair of non-volatile memory circuits NV1 and NV2 respectively connected to the node N1 and the node N2. The non-volatile memory circuits NV1 has a boot NMOS transistor Q1 and a variable resistance element VR1 connected in series with the boot NMOS transistor Q1. One of terminals of the transistor Q1 is connected to the node N1, another terminal thereof is connected to the variable resistance element VR1, and a gate thereof is connected to a boot control line BOOTn. Moreover, one of terminals of the variable resistance element VR1 is connected to the transistor Q1, and another terminal thereof is connected to a source line SL.

The non-volatile memory circuits NV2 has a recovery NMOS transistor Q2 and a variable resistance element VR2 connected in series with the recovery NMOS transistor Q2. One of terminals of the transistor Q2 is connected to the node N2, another terminal thereof is connected to the variable resistance element VR2, and a gate thereof is connected to a recovery control line RECOVn. Moreover, one of terminals of the variable resistance element VR2 is connected to the transistor Q2, and another terminal thereof is connected to the source line SL.

FIG. 2 is an example of bias voltages applied to each part during forming, setting and resetting of the memory circuit. For example, during forming of the variable resistance element VR1, the power voltage Vcc is applied to the bit line BLm, the ground voltage GND is applied to the source line SL, 1.4V is applied to the gate (BOOTn) of the boot transistor Q1, and the power voltage Vcc is applied to the gate (WLn) of the access transistor TN3. The voltage VDD of the first voltage supply portion V1 is set to 2.9V lower than the power voltage Vcc. A bias is applied to the variable resistance element VR1 in a manner from the node N1 towards the source line SL, such that a current flows in the above direction, and the variable resistance element VR1 is in a low resistance state. Forming of the variable resistance element VR2 is the same.

In case of the setting writing, the voltage VDD of the first voltage supply portion V1 is set to 2.2V, 1.7V is applied to the gate (BOOTn) of the boot transistor Q1, and a bias voltage and a bias current slightly smaller than that in forming are applied to the first voltage supply portion V1.

When the node N1 is at the H level, the power voltage Vcc of the bit line BLm is supplied to the node N1 through the transistor TN3, so that the node N1 is maintained to the H level. The bias is applied to the variable resistance element VR1 in the manner from the node N1 towards the source line SL, so that a current flows in the bias direction, as a result, the variable resistance element VR1 is in the low resistance state. On the other hand, when the node N1 is at the L level, the level of the node N1 is pulled up by the power voltage Vcc of the bit line BLm, and the node N1 is inverted from the L level to the H level. The bias is applied to the variable resistance element VR1 in the manner from the node N1 towards the source line SL, so that a current flows in the bias direction, as a result, the variable resistance element VR1 is in the low resistance state.

In case of the reset writing, the bias inverting the bias direction of the setting writing is applied to the variable resistance element VR1, i.e. the ground voltage GND is applied to the bit line BLm, 2.7V is applied to the source line SL, 2.9V is applied to the gate (BOOTn) of the boot transistor Q1, the power voltage Vcc is applied to the gate (WLn) of the access transistor TN3, and 2.7V is set to the voltage VDD of the voltage supply portion V1.

When the node N1 is at the H level, the level of the node N1 is pulled down to the ground voltage GND of the bit line BLm through the transistor TN3, and the node N1 is inverted from the H level to the L level. The bias is applied to the variable resistance element VR1 in the manner from the source line SL towards the node N1, so that a current flows in the bias direction, as a result, the variable resistance element VR1 is in the high resistance state. On the other hand, when the node N1 is at the L level, the node N1 is maintained to the L level. The bias is applied to the variable resistance element VR1 in the manner from the source line SL towards the node N1, so that a current flows in the bias direction, as a result, the variable resistance element VR1 is in the high resistance state.

The boot data is data required for initializing the system or device when the system or the device is started.

In the conventional general method, when the power is turned on, the ROM storing the boot data is accessed, and the boot data read from the ROM is written to the memory circuit 100. In the embodiment, the memory circuit 100 has a build-in non-volatile memory circuit NV1, and therefore, the boot data read from the non-volatile memory circuit NV1 when the power is turned on may be immediately set to the node N1 of the bi-stable circuit. Compared with the conventional method, the time required to set the boot data may be shortened. Meanwhile, it is possible to cut out the ROM used for storing the boot data or to reduce a storage capacity of the ROM.

The non-volatile memory circuit NV2 is then described below. The memory circuit 100 configured with the SRAM has a faster access time than other volatile memory, and therefore, it is used as a cache memory. The memory circuit 100 of the embodiment has the build-in non-volatile memory circuit NV2, so that the data held in the bi-stable circuit may be saved to the non-volatile memory circuit NV2, which makes it possible to restore the held data.

Then, setting writing and reset writing of the non-volatile memory circuit NV2 are described. The above operations are controlled by a controller that is not shown in the figure.

First, when the node N2 holds data with the H level, the setting writing is performed to the non-volatile memory circuit NV2. Now, the access transistor TN4 may be in a non-conducting state or a conducting state. In case that the access transistor TN4 is in the conducting state, the bit line /BLm is a floating state precharged with the power voltage Vcc. The bias is applied to the variable resistance element VR2 in the manner from the node N2 towards the source line SL, so that a current flows in the bias direction, as a result, the variable resistance element VR1 is in the low resistance state. In this case, the node N2 is inverted from the H level to the L level. In case that the bit line /BLm is connected to the node N2, the current flows until a potential of the bit line /BLm is discharged to the ground voltage GND.

When the node N2 holds data with the L level, the reset writing is performed to the non-volatile memory circuit NV2. Now, the access transistor TN4 may be in the non-conducting state or the conducting state. The bias is applied to the variable resistance element VR2 in the manner from source line SL towards the node N2, so that a current flows in the bias direction, as a result, the variable resistance element VR1 is in the high resistance state. In the reset writing, the source line SL is 2.7V, a gate voltage of the transistor Q2 is 2.9V, and a large drain current flows from the transistor Q2 towards the node N2. Therefore, the node N2 is inverted from the L level to the H level.

The controller reads out the data of the H level or the L level from the node N2 of the bi-stable circuit through the bit line /BLm, and writes the data held in the node N2 to the non-volatile memory circuit NV2 through setting writing or reset writing based on the readout result.

Moreover, in case that the controller writes data to the non-volatile memory circuit NV2, the controller may execute writing verification. The writing verification is performed by reading the data written into the non-volatile memory circuit NV2. Namely, the transistor TN4 is turned on through the word line WLn, the transistor Q2 is turned on through the recovery control line RECOVn, and a positive readout voltage is applied to the bit line /BLm.

Moreover, in case that the data stored in the non-volatile memory circuit NV2 is restored to the bi-stable circuit, reset writing is performed to the non-volatile memory circuit NV2 subjected to the setting writing. 2.7V is applied to the source line SL, and the transistor Q2 is turned on to pull up the level of the node N2 to the H level. On the other hand, setting writing is performed to the non-volatile memory circuit NV2 subjected to the reset writing. The power voltage Vcc is applied to the bit line /BLm, and the transistor Q2 is turned on to pull down the level of the node N2 to the ground voltage GND of the source line SL.

Moreover, regarding the operation of the non-volatile memory circuit NV2, when the data from the variable resistance element VR2 itself is selected, forward rotation and reverse rotation are generated through an amount of charges remained in the node N2, but ideally, the operation is started when the word line WLn is in the GND state and the node N1 is in the GND state. A discharging time of the charges of the node N2 is managed through a positive pulse signal applied to the gate RECOVn of the transistor Q2

Figure 3:
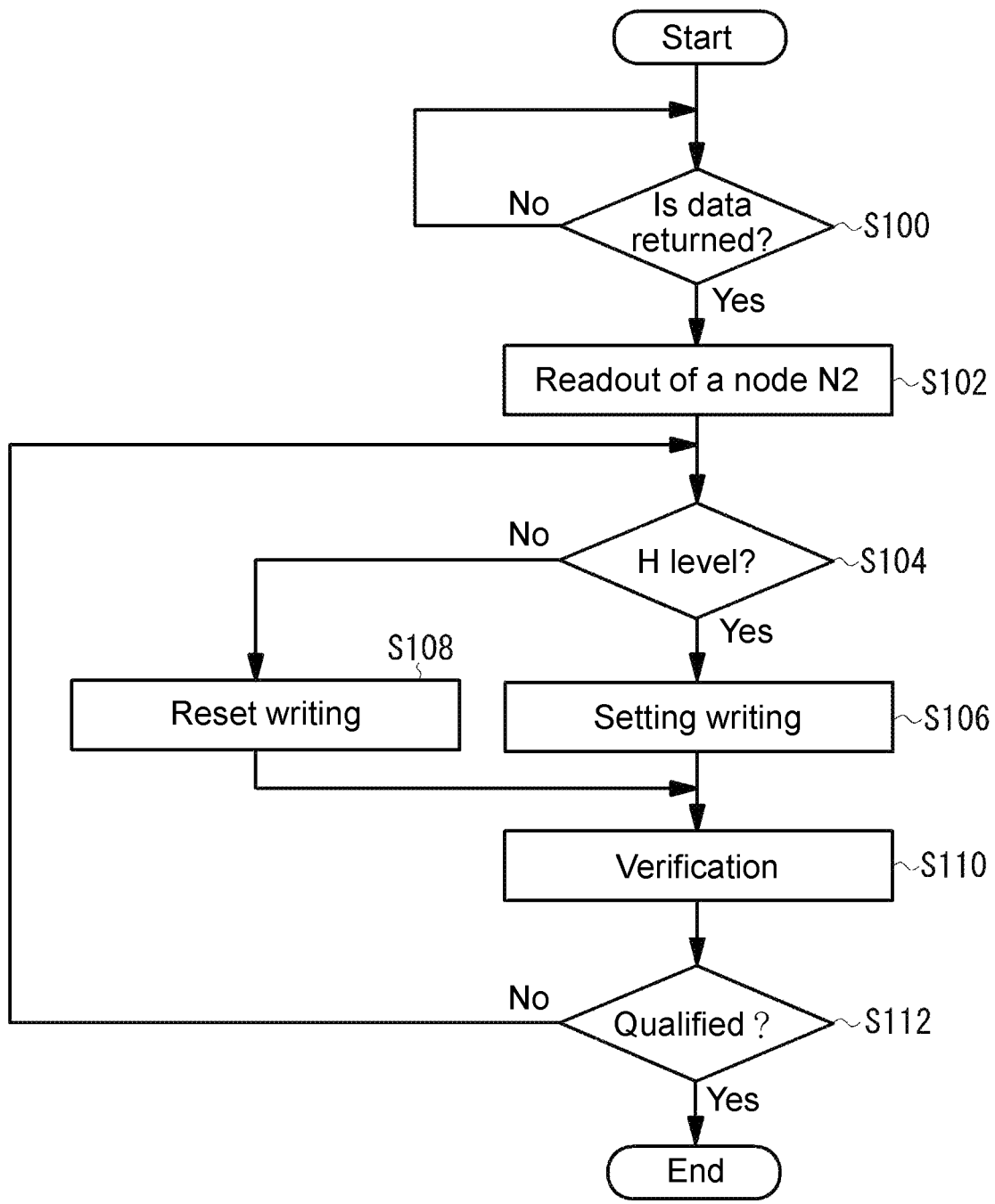
FIG. 3 is an example of an operation flow of writing data held by the memory circuit to a non-volatile memory circuit according to an embodiment of the invention.

FIG. 3 is an example of an operation flow of writing the data held by the bi-stable circuit to the non-volatile memory circuit NV2. The controller used for controlling the memory circuit 100 determines whether to return (save) the data held by the node N2 to the non-volatile memory circuit NV2 (S100). The timing for saving the data is arbitrary. For example, the data is saved when the power is about to be shutdown suddenly, when the power voltage is changed, when a predetermined time is reached, or when a certain time interval is complied, etc. When it is determined to save the data, controller accesses a specific memory unit of the SRAM according to a column-row address, so as to read out the data of the node N2 (S102).

Then, the controller detects whether the data of the node N2 has the H level or the L level (S104). In case of the H level, the controller performs the setting writing to the non-volatile memory circuit NV2 (S106), or in case of the L level, the controller performs the reset writing to the non-volatile memory circuit NV2 (S108). Then, the controller performs verification readout to the non-volatile memory circuit NV2 (S110). If the verification is failed, the setting writing or the reset writing is again performed, otherwise, the sequence is ended. Moreover, verification of the written data is arbitrary.

Figure 4:
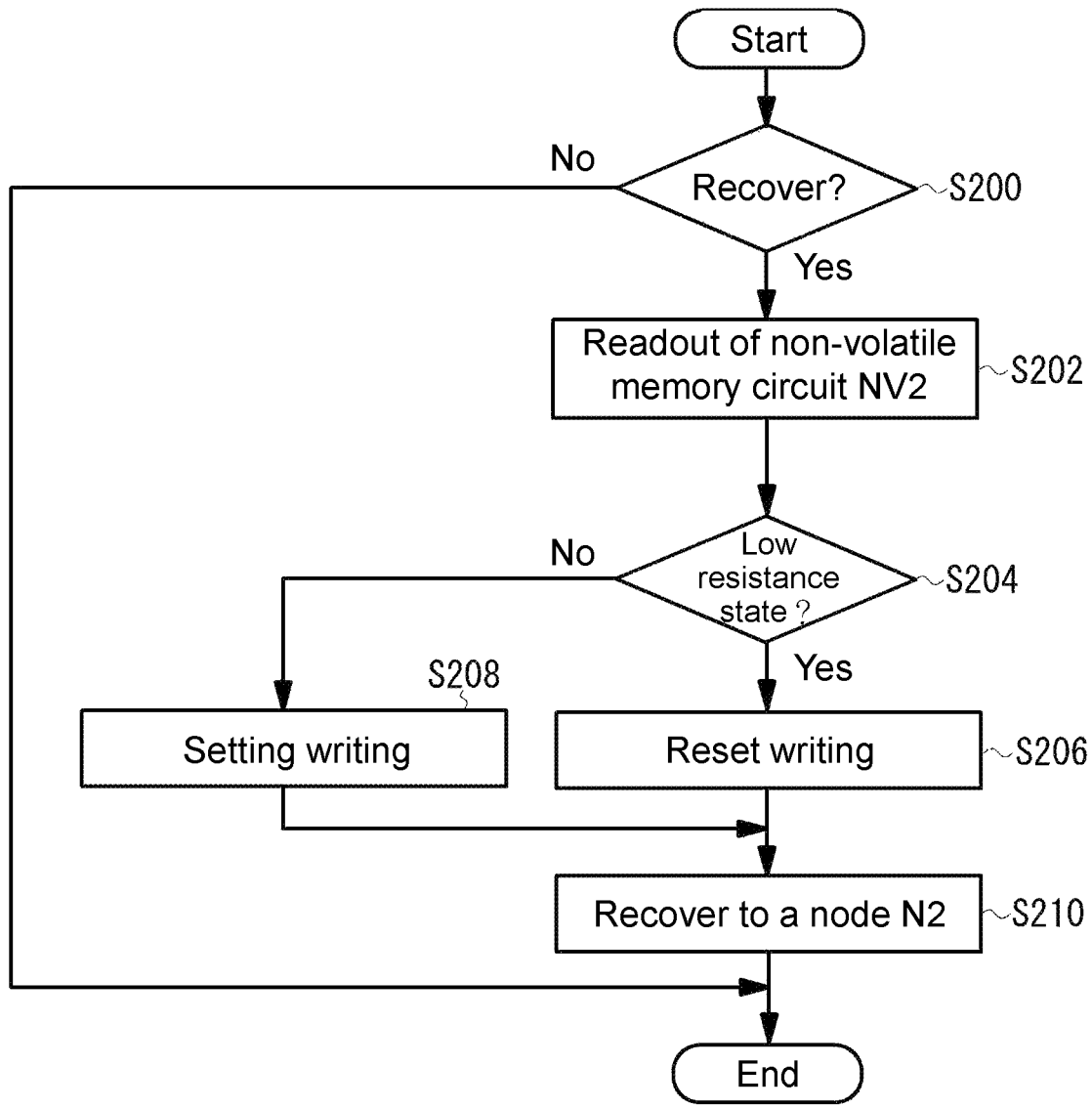
FIG. 4 is an example of an operation flow of recovering data stored by the non-volatile memory circuit in the memory circuit to the bi-stable circuit.

FIG. 4 is an example of an operation flow of recovering data stored by the non-volatile memory circuit to the memory circuit. The controller determines whether to recover the data of the non-volatile memory circuit NV2 (S200). The timing for recovery is arbitrary, for example, when the power is switched on after the power is shutdown suddenly.

When it is determined to recover the data, the controller access the specific memory unit according to a column-row address to read out the data stored in the non-volatile memory circuit NV2 (S202). Then, the controller determines whether the non-volatile memory circuit NV2 is in the low resistance state (i.e. data "0", "1") based on the readout data (S204), and performs the reset writing in case of the low resistance state (S206), and performs the setting writing in case of the high resistance state (S208). Therefore, the data stored in the non-volatile memory circuit NV2 is recovered to the node N2 (S210).

Then, application of the memory circuit of the invention is described below. As described above, the memory circuit of the embodiment may be used in form of SRAM or a latch circuit, and in an implementation, the memory circuit is assembled to a logic device or a controller. For example, in a memory device composed of a plurality of stacked NAND flash memory chips, the memory circuit of the embodiment is assembled to a controller controlling each of the NAND flash memory chips. The memory circuit holds the boot data of each of the flash memories, and backs up update data of each of the flash memories.

Figure 5:
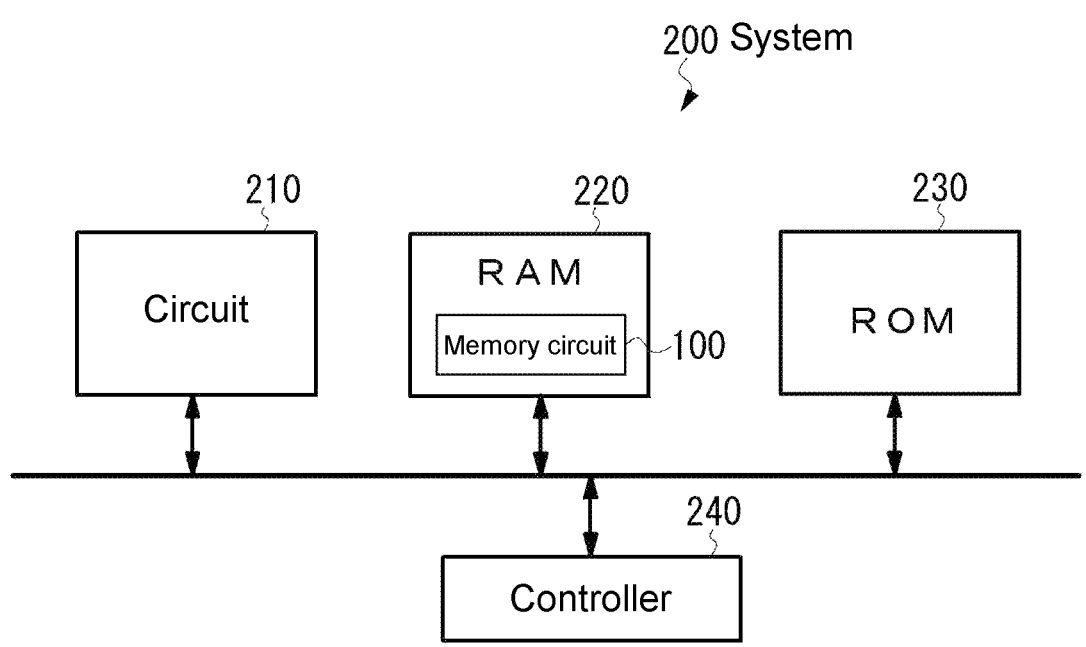
FIG. 5 is an example of a system including the storage device of the embodiment of the invention.

FIG. 5 is an example of a system including the memory circuit 100 of the embodiment. The system 200 of the embodiment includes a circuit 210, a Random Access Memory (RAM) 220, a ROM 230 and a controller 240. The controller 240 controls the circuit 210, the RAM 220 and the ROM 230.

The circuit 210 is any circuit of the system, for example, a memory (for example, a flash memory), a logic device, a driver, an Analog-to-Digital (A/D) or (Digital-to-Analog (D/A) converter, a voltage generating circuit, a level shifter, etc.

The RAM 220 is, for example, an SRAM, and one memory unit is as shown in FIG. 1, which includes the bi-stable circuit and the non-volatile memory circuit NV1 and the non-volatile memory circuit NV2 connected to the node N1 and the node N2 of the bi-stable circuit. The RAM 220 may serve as a cache memory of the controller 240, and a cache code, etc., is stored to the non-volatile memory circuit NV2 during the operation of the system. Moreover, the boot data required for starting the system is stored in the non-volatile memory circuit NV1 of the RAM 220.

The ROM 230 stores a program or software executed by the controller 240. For example, the ROM 230 stores a power up sequence program executed when the power is switched on. When the controller 240 is power-on, the controller 240 executes the power up sequence program to set the boot data stored in the non-volatile memory circuit NV1 to the node N1 of the bi-stable circuit, and performs initial setting of the circuit 210 based on the boot data. Moreover, the ROM 230 stores a recovery program used for saving the data held by the RAM 220 to the non-volatile memory circuit NV2 or recovering the RAM 220 through the saved data. The controller 240 executes the recovery program to, for example, save the volatile data to the non-volatile memory circuit NV2 when the power voltage becomes unstable; and recover the saved data to the bi-stable circuit when the power voltage is stable.

In the embodiment, the variable resistance elements are applied to the non-volatile memory circuit NV1 and the non-volatile memory circuit NV2, but the invention is not limited thereto, and other non-volatile memory elements (for example, magnetic memories, flash memories, etc.) may also be used.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A memory circuit, comprising:
   a bi-stable circuit, capable of holding complementary data respectively at a first node and a second node of the bi-stable circuit;
   a non-volatile memory circuit, connected to one of the first node and the second node; and
   another non-volatile memory circuit, connected to another one of the first node and the second node,
   wherein when the non-volatile memory circuit stores data held by the one of the first node and the second node, a logic level of the data held by the one of the first node and the second node is inverted,
   wherein the another non-volatile memory circuit stores boot data required when power is switched on.

2. The memory circuit as claimed in claim 1, wherein the non-volatile memory circuit comprises a variable resistance element,
   when the data held by the one of the first node and the second node has a first logic level, setting writing of the variable resistance element is performed, and
   when the data held by the one of the first node and the second node has a second logic level, reset writing of the variable resistance element is performed.

3. The memory circuit as claimed in claim 2, wherein the non-volatile memory circuit comprises an access transistor and the variable resistance element connected in series between the one of the first node and the second node and a source line,
   when the setting writing of the variable resistance element is performed, the access transistor is in a conducting state, and a bias from the one of the first node and the second node towards the source line is applied to the variable resistance element,
   when the reset writing of the variable resistance element is performed, the access transistor is in the conducting state, and a bias from the source line towards the one of the first node and the second node is applied to the variable resistance element.

4. The memory circuit as claimed in claim 2, wherein when the data stored in the non-volatile memory circuit is set to the one of the first node and the second node, the reset writing is performed to the variable resistance element subjected to the setting writing, and the setting writing is performed to the variable resistance element subjected to the reset writing.

5. The memory circuit as claimed in claim 2, wherein the one of the first node and the second node is connected to the bit line through the transistor, and a verification is performed by reading out data stored in the variable resistance element through the bit line.

6. The memory circuit as claimed in claim 1, wherein when the power is switched on, the boot data stored by the another non-volatile memory circuit is read out to the another one of the first node and the second node.

7. The memory circuit as claimed in claim 1, wherein the another non-volatile memory circuit comprises an access transistor and a variable resistance element connected in series between the another one of the first node and the second node and the source line.

8. A semiconductor device, comprising:
   a memory circuit, as claimed in claim 1; and
   a controller, controlling the memory circuit.

9. The semiconductor device as claimed in claim 8, further comprising:
   at least one flash memory, controlled by the controller.

* * * * *